(12) United States Patent
Rao et al.

(10) Patent No.: US 6,366,231 B1
(45) Date of Patent: Apr. 2, 2002

(54) INTEGRATE AND FOLD ANALOG-TO-DIGITAL CONVERTER WITH SATURATION PREVENTION

(75) Inventors: Naresh Kesavan Rao, Clifton Park; Daniel David Harrison, Delanson; Donald Thomas McGrath, Clifton Park; Jerome Johnson Tiemann, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/546,623

(22) Filed: Apr. 10, 2000

(51) Int. Cl.$^7$ .................................................. H03M 1/50
(52) U.S. Cl. ...................................... 341/166; 341/156
(58) Field of Search ................................. 341/156, 157, 341/161, 162, 163, 166, 167

(56) References Cited

U.S. PATENT DOCUMENTS

| | | | |
|---|---|---|---|
| 3,703,002 A | * 11/1972 | Van Saun | 341/162 |
| 4,144,527 A | * 3/1979 | Butler et al. | 340/347 AD |
| 4,965,578 A | * 10/1990 | Poujois | 341/157 |
| 5,101,206 A | * 3/1992 | Riedel | 341/156 |
| 5,117,227 A | * 5/1992 | Goeke | 341/156 |
| 5,126,743 A | * 6/1992 | Hobbs | 341/157 |
| 5,262,779 A | * 11/1993 | Sauer | 341/161 |
| 5,748,134 A | * 5/1998 | Dent | 341/172 |

* cited by examiner

*Primary Examiner*—Howard L. Williams
(74) *Attorney, Agent, or Firm*—John F. Thompson; Jill M. Breedlove

(57) ABSTRACT

An analog to digital conversion circuit for converting an analog input signal into a plurality of binary output bits includes an operational amplifier and an integrating capacitor for storing a charge proportional to the integral of the input signal. A charge subtracting circuit removes a first predetermined charge from the integrating capacitor when an output charge of the operational amplifier is substantially equal to a second predetermined charge. The first predetermined charge level is removed from the integrating capacitor a number of times. The removal of the first predetermined charge from the integrating capacitor allows the integral of the analog input signal to be larger than a maximum charge capable of being stored by the integrating capacitor. A digital logic circuit tracks the number of times that the first predetermined charge is removed from the integrating capacitor by the charge subtracting circuit, and the digital logic circuit provides at least one bit of the plurality of binary output bits. A residue quantizing circuit determines a residual charge in the integrating capacitor and provides at least one additional bit of the plurality of binary output bits corresponding to the residual charge. The residual charge is substantially equal to a stored charge in the integrating capacitor after the first predetermined charge has been removed the number of times.

30 Claims, 5 Drawing Sheets

INTEGRATE AND FOLD ANALOG-TO-DIGITAL CONVERTER WITH SATURATION PREVENTION

BACKGROUND OF THE INVENTION

The present invention relates to an integrate and fold circuit used in an analog to digital conversion circuit, and more particularly to an integrate and fold circuit for converting an analog input signal of a digital x-ray and/or computed-tomography (CT) system into digital output bits.

Conventional analog to digital conversion circuits typically include charge to voltage converters that typically comprise an operational amplifier with an integrating capacitor connected between an inverting terminal and an output terminal of the operational amplifier. A linear relationship exits between the input charge (Qin) and the output voltage (Vout) of the operational amplifier when the operational amplifier operates within a characteristic active region. The linear relationship between the input charge (Qin) and the output voltage (Vout) of the operational amplifier is represented as follows:

$$Q_{in} = C_{int} \cdot V_{out};$$

where Qin is the input charge in coulombs; Cint is the capacitance of the integrating capacitor in farads; and Vout is the output voltage of the operational amplifier in volts. Characteristically, the operational amplifier can hold a finite amount of charge before the operational amplifier saturates and begins to display a non-linear relationship between the input charge (Qin) and the output voltage (Vout).

In analog to digital conversion circuits, linear operation of the operational amplifier is desired to accurately resolve the analog input signal into digital output bits. However, to accommodate a large range of input charges (Qin), conventional analog to digital conversion circuits include a capacitor bank containing a plurality of integration capacitors. During operation, one of the plurality of integration capacitors is chosen based on the level of the input charge (Qin) such that the integration amplifier does not saturate and the linear relationship between the input charge (Qin) and the output voltage (Vout) is maintained.

In many applications, it is desired that the analog to digital conversion circuit be integrated in a circuit die. However, the bank of the plurality of integration capacitors requires a large portion of die area. As such, an integrated circuit containing a plurality of integration capacitors occupies a large area on the die and, therefore, increases the cost of each analog to digital conversion circuit. It is desired to have the charge to voltage converter of the analog to digital conversion circuit operate in the active region of the operational amplifier when resolving the analog input signal into digital output bits. In addition, it is desired that a small capacitor be used in the charge to voltage converter so that the analog to digital conversion circuit occupies less area when integrated on a circuit die.

In other applications, the analog to digital conversion circuit is designed so that the power supply voltage is as low as possible such that the power consumption of the circuit is reduced. These systems with lower power supply voltages also have lower input charges (Qin) to the operational amplifier. Therefore, the integration capacitor (Cint) is designed to be large in order to maintain a large output voltage (Vout) range. As explained above, large integration capacitors occupy large die areas when integrated into a circuit die, and, as such, the cost per analog to digital conversion circuit is increased. Therefore, it is desired to have an analog to digital conversion circuit that comprises a small capacitor such that a smaller die area is required for an integrated circuit, and further such that the small capacitor also maintains a relatively large output voltage (Vout) range.

In conventional analog to digital conversion circuits, the output voltage (Vout) is constrained to only half of the dynamic range of the power supply voltage when the input charge (Qin) is fixed. For example, in conventional circuits, when the direction of the current flow of the input charge (Qin) is fixed, the output voltage (Vout) will increase from analog ground to positive power supply voltage. Therefore, only the positive half of the power supply voltage range (from zero to positive power supply voltage) is used, and the negative half (from zero to negative power supply voltage) is not used. For conventional analog to digital conversion circuits to use the full dynamic range of the power supply voltage, level-shifting circuitry is required. This level-shifting circuitry also occupies valuable integrated circuit die space and can introduce delays in the analog to digital conversion. Therefore, an analog to digital conversion circuit is desired that used uses the full dynamic range of the power supply voltage without the use of level-shifting circuitry.

BRIEF SUMMARY OF THE INVENTION

In one exemplary embodiment of the present invention, an analog to digital conversion circuit is provided for converting an analog input signal into a plurality of binary output bits. The analog to digital conversion circuit includes an operational amplifier having an inverting terminal and an output terminal, and the analog input signal being connected to the inverting terminal. An integrating capacitor is connected between the inverting terminal and the output of the operational amplifier. The integrating capacitor stores a charge proportional to the integral of the input signal. A charge subtracting circuit is selectively coupled to the inverting terminal and the output of the operational amplifier. The charge subtracting circuit removes a first predetermined charge from the integrating capacitor when an output charge of the operational amplifier is substantially equal to a second predetermined charge. The first predetermined charge is removed from the integrating capacitor a number of times. The removal of the first predetermined charge a number of times allows the integral of the analog input signal to be larger than a maximum charge capable of being stored by the integrating capacitor.

A digital logic circuit is connected to the charge subtracting circuit. The digital logic circuit tracks the number of times that the first predetermined charge is removed from the integrating capacitor by the charge subtracting circuit, and the digital logic circuit provides at least one bit of the plurality of binary output bits. A residue quantizing circuit is connected to the integrating capacitor and the output of the operational amplifier. The residue quantizing circuit determines a residual charge in the integrating capacitor and provides at least one additional bit of the plurality of binary output bits corresponding to the residual charge. The residual charge is substantially equal to the stored charge in the integrating capacitor after the first predetermined charge has been removed from the integrating capacitor a number of times. A low pass filter circuit is selectively coupled to the output of the operational amplifier when the number of times that the first predetermined charge is removed from the integrating capacitor is less than a predetermined number.

In another embodiment, the residue quantizing circuit includes a plurality of integrate and fold circuits. Each of the integrate and fold circuits are connected in a pipeline series configuration and include a sample and hold circuit connected to an output of a preceding integrate and fold circuit for receiving an integrate and fold residual charge. A first of the plurality of integrate and fold circuits is connected to the integrating capacitor and the output of the operational amplifier to receive the residual charge in the integrating capacitor. An integrate and fold operational amplifier has an inverting terminal and an output terminal, and the sample and hold circuit is connected to the inverting terminal of the integrate and fold operational amplifier. An integrate and fold integrating capacitor is connected between the inverting terminal and the output of the integrate and fold operational amplifier. The integrate and fold integrating capacitor stores an integrate and fold charge level proportional to the integral of the integrate and fold residual charge from the preceding integrate and fold circuit. An integrate and fold charge subtracting circuit is selectively coupled to the inverting terminal and the output of the integrate and fold operational amplifier. The integrate and fold charge subtracting circuit removes a first integrate and fold predetermined charge from the integrate and fold integrating capacitor when an output charge of the integrate and fold operational amplifier is substantially equal to a second integrate and fold predetermined charge. The first integrate and fold predetermined charge is removed from said integrate and fold integrating capacitor a number of times. An integrate and fold digital logic circuit is connected to the integrate and fold charge subtracting circuit and tracks the number of times that the first integrate and fold predetermined charge is removed from the integrate and fold integrating capacitor by the integrate and fold charge subtracting circuit. The integrate and fold digital logic circuit provides the at least one additional bit of the plurality of binary output bits.

DETAILED DESCRIPTION OF THE INVENTION

Figure 1:
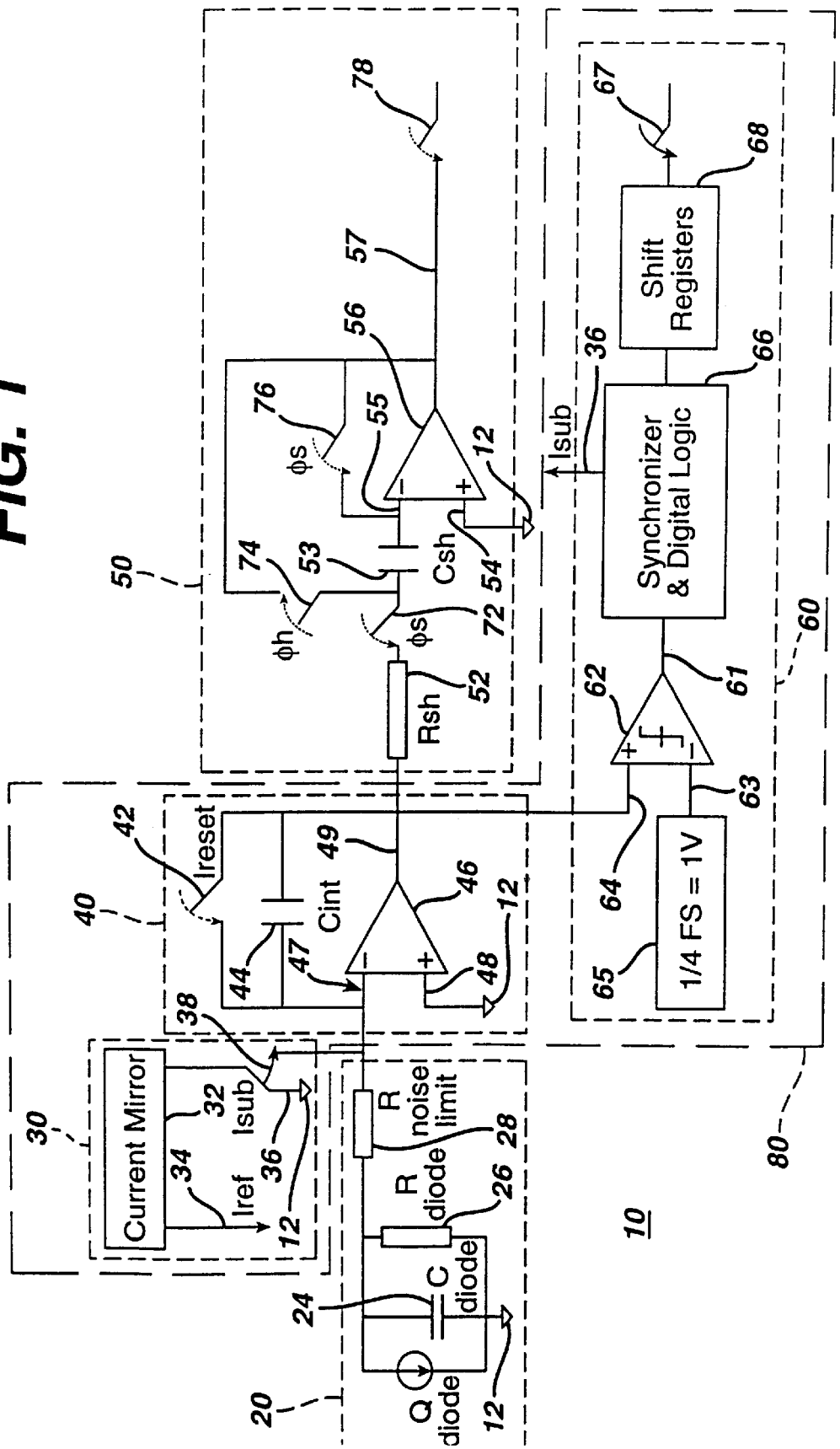
FIG. 1 illustrates a schematic diagram of an exemplary embodiment of an analog to digital conversion circuit.
Figure 3:
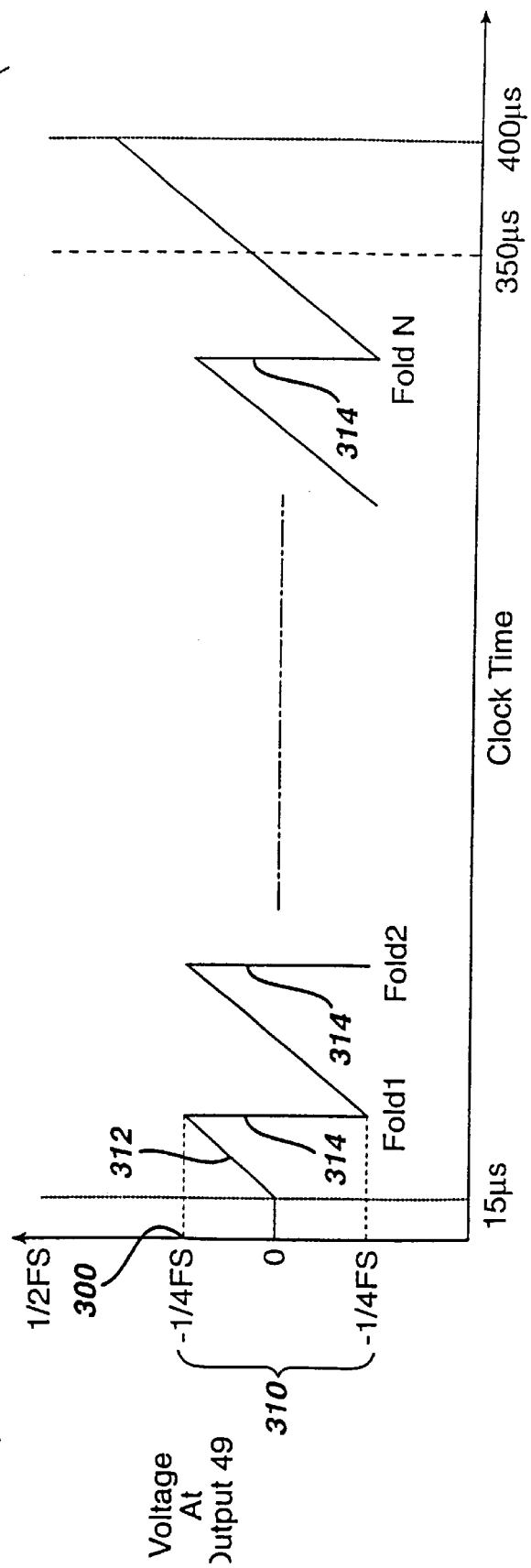
FIG. 3 illustrates voltage waveforms from an output of an integrate and fold circuit.

As shown in FIG. 1, one exemplary embodiment of an analog to digital conversion (ADC) circuit 10 converts an analog input signal into a plurality of binary output bits. The analog to digital conversion circuit 10 comprises an integrating operational amplifier circuit 40 connected to an input signal circuit 20, a folding circuit 30, a sample and hold circuit 50 and a digital logic circuit 60. The integrating operational amplifier circuit 40, the folding circuit 30 and the digital logic circuit 60 comprise an integrate and fold circuit 80. In one embodiment, the folding circuit 30 can also be termed charge subtracting circuit, and the integrating operational amplifier circuit 40 can also be termed a charge to voltage converter. The analog input signal is provided from the input signal circuit 10 to the integrating operational amplifier circuit 40 that stores a charge proportional to the integral of the analog input signal. The digital logic circuit 60 determines when the charge in the integrating operational amplifier circuit 40 reaches a first predetermined charge level 300 (FIG. 3). When the first predetermined charge level 300 (FIG. 3) is reached, the digital logic circuit 60 directs the folding circuit 30 to remove a second predetermined charge level 310 (FIG. 3) from the integrating operational amplifier circuit 40. The digital logic circuit 60 keeps track of the number of times the second predetermined charge level 310 (FIG. 3) is removed from the integrating operational amplifier circuit 40. After a predetermined amount of time, the digital logic circuit 60 determines at least one bit from the number of times that the second predetermined amount of charge was removed from the integrating operational amplifier circuit 40. A residual charge level in the integrating operational amplifier circuit 40 is supplied to the sample and hold circuit 50. At least one additional bit is determined from the residual charge level. The bits resolved by the digital logic circuit 60 and the additional bits resolved from the residual charge comprise the plurality of binary output bits. It should be appreciated that, as used herein, the terms charge and charge level have the same meaning and are used interchangeably.

The integrate and fold circuit 80 operates to prevent the integrating operational amplifier circuit 40 from saturating and, thus, displaying non-linear characteristics. The linear characteristics of the integrating operational amplifier circuit 40 are maintained by removing the second predetermined charge level 310 (FIG. 3) from the integrating capacitor 44 before the stored charge saturates the operational amplifier 46. The number of times the second predetermined charge level 310 (FIG. 3) is removed from the integrating capacitor 44 is tracked and used to determine at least one binary output bit while the residual charge in the integrating capacitor 44 is used to determine additional binary output bits of the binary output bits. In one embodiment, the integrate and fold circuit 80 determines the most significant bits of the plurality of binary output bits while the residual charge is used to determine the least significant bits of the plurality of binary output bits. As such, the analog to digital conversion circuit 10 can use a relatively small integrating capacitor 44 such that integration of the analog to digital conversion circuit 10 into an integrated circuit die requires a smaller portion of the die area. The removal of the second predetermined charge level 310 (FIG. 3) from the integrating capacitor 44 for the number of times allows the integral of the analog input signal to be larger than a maximum charge capable of being stored by the integrating capacitor 44. In addition, since the second predetermined charge level 310 (FIG. 3) is removed from the integrating capacitor 44 before the operational amplifier 46 saturates, a capacitor bank containing a plurality of capacitors (not shown) or a single large capacitor (not shown) is not required to maintain a large dynamic range of voltages from the output 49 from the analog to digital conversion circuit 10.

As stated above and illustrated in FIG. 1, the integrate and fold circuit 80 comprises the integrating operational amplifier circuit 40, the folding circuit 30 and the digital logic circuit 60. The input circuit 20 provides the analog input signal to an inverting input terminal 47 of the operational amplifier 46, and the sample and hold circuit 50 is connected to an output 49 of the operational amplifier 46. In one embodiment, as shown in FIG. 1, the input signal circuit 20 includes a photo-diode 22 that is connected to a capacitor 24, a resistor 26, a noise limiting resistor 28 and ground 12. In a preferred embodiment, the photo-diode 22 provides images from a medical device, such as a digital x-ray device or a computed-tomography (CT) system. However, it should be appreciated that the analog input signal can be provided from any source or device and is supplied to the inverting terminal input 47 of the integrate and fold circuit 80. It should be appreciated that in one embodiment the analog input signal can comprise a current signal, and in this case, the current signal can be applied directly to the inverting input terminal 47. It should be appreciated that in another embodiment the analog input signal comprises a voltage signal. In the latter case, the voltage signal is applied to the inverting input terminal 47 via a conductance (not shown) that converts the voltage into a current.

In the embodiment shown in FIG. 1, the analog input signal is provided to the integrate and fold circuit 80 via the inverting input terminal 47 of the operational amplifier 46 of the integrating operational amplifier circuit 40. The non-inverting terminal 48 of the operational amplifier 46 is connected to ground 12. In a preferred embodiment, the ground 12 is at ground potential. The integrating capacitor 44 is connected across the inverting input terminal 47 and the output 49 of the operational amplifier 46. Also, a reset switch 42 is connected across the inverting input terminal 47 and the output 49.

The digital logic circuit 60 is connected to the output 49 of the operational amplifier 46 via a non-inverting input terminal 64 of comparator 62. An inverting input terminal 63 of the comparator 62 is connected to a voltage source 65. In one embodiment, the voltage source 65 comprises ¼ the voltage of the full-scale (FS) voltage, such as, for example, 1 volt where the full-scale (FS) voltage is 4 volts. An output 61 of the comparator 62 is connected to a synchronizer/digital logic circuit 66. A shift register 68 is connected between the synchronizer/digital logic circuit 66 and the output switch 67.

A subtraction current 36 is provided by the digital logic circuit 60 to the folding circuit 30 via current mirror switch 38. The folding circuit 30 comprises a current mirror 32 connected to a reference current 34 and the current mirror switch 38. When the current mirror switch 38 is open, the subtraction current 36 and the current mirror 32 are connected to ground 12. When the current mirror switch 38 is closed, the subtraction current 36 and the current mirror 32 are connected to the inverting terminal 47 of the operational amplifier 46. In one embodiment, the reference current 34 is proportional to the subtraction current 36 and can be set manually or via a control system, such as, for example, the synchronizer/digital logic circuit 66.

The output of the operational amplifier 46 is also connected to the sample and hold circuit 50 via resistor 52. A first sample switch 72 is connected between resistor 52 and capacitor 53. Inverting input terminal 55 of amplifier 56 is connected to capacitor 53, and a switch 76 is connected between inverting terminal 55 and output 57 of amplifier 56. A hold switch 74 is connected between the first sample switch 72 and the output 57. Non-inverting input terminal 54 of amplifier 56 is connected to ground 12. Output 57 of the amplifier 56 is connected to output switch 78.

Figure 4:
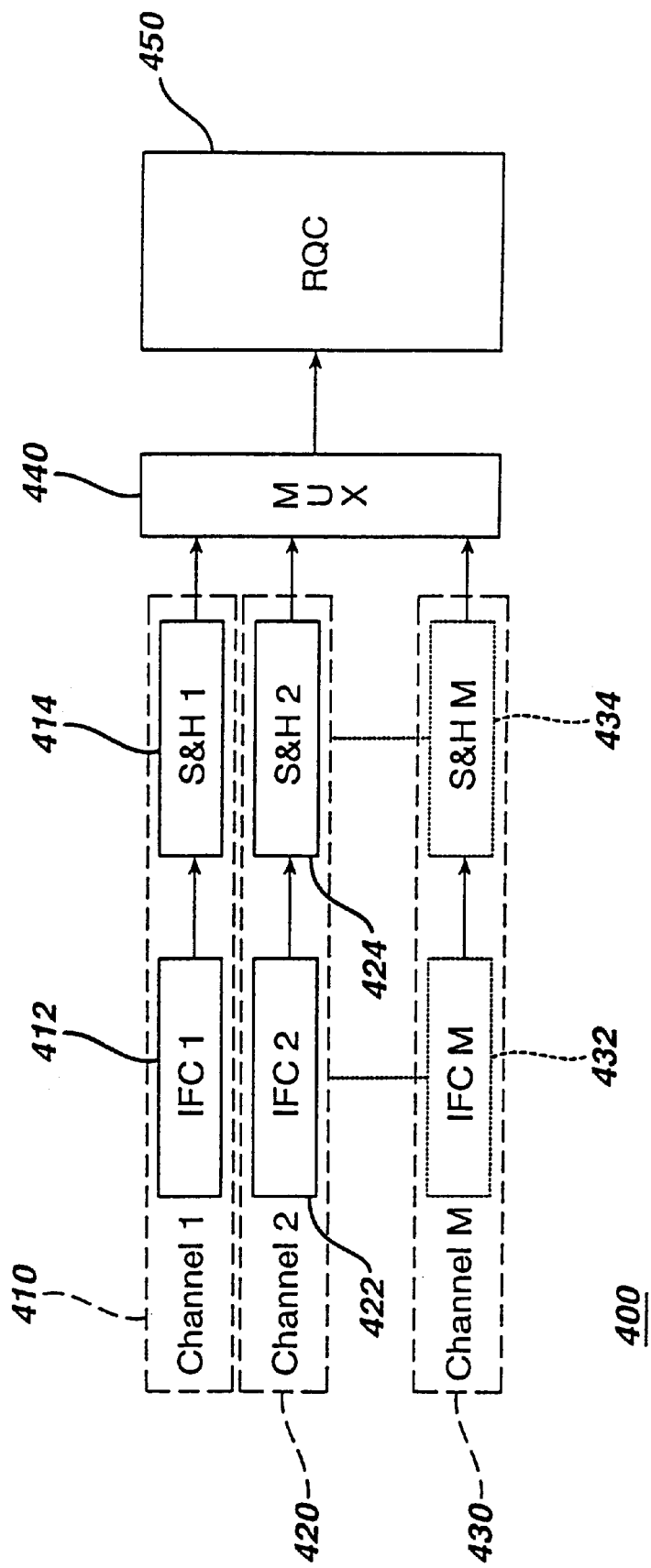
FIG. 4 illustrates a block diagram of an exemplary embodiment of a pipeline analog to digital conversion circuit.

As explained above, the digital logic circuit 60 and the folding circuit 30 subtract a second predetermined charge level 310 (FIG. 3) from the integrating capacitor 44 whenever a first predetermined charge level 300 (FIG. 3) is reached in the integrating operational amplifier circuit 40. In another embodiment, the folding circuit 30 subtracts the second predetermined charge 310 (FIG. 3) from the integrating capacitor 44 whenever the charge across the integrating capacitor 44 is substantially equal to the first predetermined charge 300 (FIG. 3). This subtraction of charge folds the voltage at the output 49 to a lower full-scale (FS) voltage value and prevents the operational amplifier 46 from saturating. In one embodiment, the first predetermined charge level 300 (FIG. 3) in the integrating operational amplifier circuit 40 is measured as the charge level in the integrating capacitor 44. In another embodiment, the first predetermined charge level 300 (FIG. 3) in the integrating operational amplifier circuit 40 is measured as the voltage at the output 49 of the operational amplifier 46. Thus, by removing charge from the integrating capacitor 44 and in turn reducing the voltage at the output 49, the linear relationship between the analog input signal and the binary output bits is maintained. The digital logic circuit 60 keeps track of the number of times the second predetermined charge level 310 (FIG. 3) is subtracted from the integrating capacitor 44, and a residual charge level in the integrating capacitor 44 is quantized by a residue quantizing circuit 450 (FIG. 4). The residual charge is substantially equal to the stored charge in the integrating capacitor 44 after the second predetermined charge level 310 (FIG. 3) has been removed from the integrating capacitor 44 for the number of times.

Figure 2:
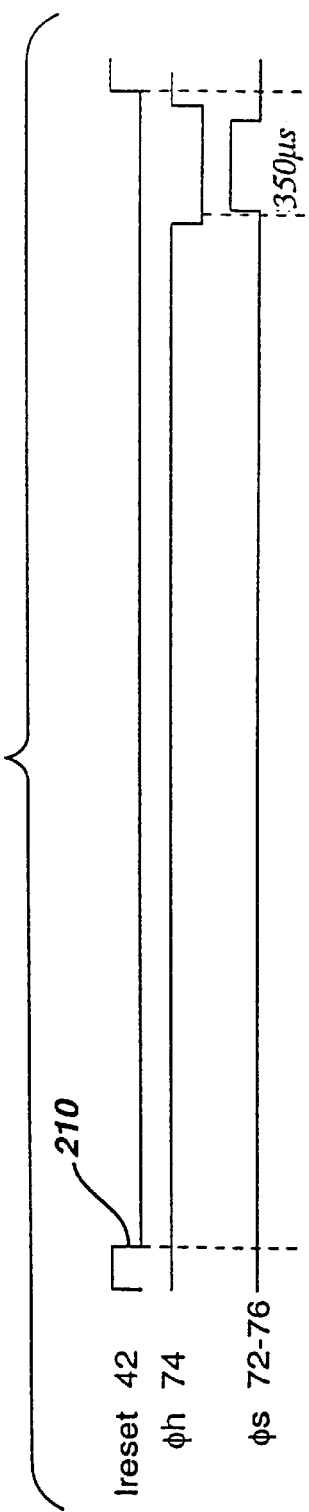
FIG. 2 illustrates timing diagrams taken from various points in FIG. 1.

In the operation of one embodiment, as illustrated in FIG. 1, and as shown in the timing diagram of FIG. 2, the integrating capacitor 44 is discharged by closing reset switch 42. At time 210, the reset switch 42 is opened and an integration cycle of the analog input signal begins. In one embodiment, time 210 is about 15 μs.

Alternatively, in a preferred embodiment, the reset switch 42 is not closed to discharge the integrating capacitor 44 because closing the reset switch 42 introduces noise into the analog to digital conversion circuit 10. Instead, the residual charge level in the integrating capacitor 44 is used as a zero reference for the next charge to be stored in the integrating capacitor 44.

As shown in FIG. 3, the voltage 312 at output 49 begins to ramp up in response to the input of the analog input signal from the input signal circuit 20. In one embodiment, when the voltage 312 at the output 49 reaches the first predetermined charge level 300, the comparator 62 trips. As stated above, it should be appreciated that, in another embodiment, the charge level in the integrating capacitor 44 can also be used to trip the comparator 62. In addition, the first predetermined charge level 300 that causes the comparator 62 to trip can be set via the voltage source 65 connected to the inverting input terminal 63 of the comparator 62. In one embodiment, as shown in FIG. 3, the first predetermined charge level 300 is set at ¼ of the full-scale (FS) voltage, such as, for example, 1 volt where the full-scale (FS) voltage is 4 volts. When the comparator 62 trips, the output 61 is synchronized to the master clock (not shown) and a digital flip flop (not shown) that are contained within the synchronizer/digital logic circuit 66. In response to the tripping of the comparator 62, the current mirror switch 38 connects the subtraction current 36 to the inverting input 47 of the operational amplifier 46 for M clock cycles, as shown in FIG. 2. In the embodiment of FIG. 2, M clock cycles corresponds to 350 μs.

Since the polarity of the subtraction current 36 is opposite to that of the analog input signal, closing the current mirror switch 38 causes charge to be removed from the integrating capacitor 44. The process of removing charge from the integrating capacitor 44 is termed as folding. As the charge is folded from the integrating capacitor 44, the voltage 312 at the output 49 of the operational amplifier 46 ramps down to a ramp down voltage 314 as shown in FIG. 3. In one embodiment, the reference current 34 is designed to be greater than the maximum analog input signal, and, hence, the voltage 312 at the output 49 of the operational amplifier 46 will ramp down to the ramp down voltage 314.

The second predetermined amount of charge ($Q_{quantum}$) 310 is represented by the following:

$$Q_{quantum} = M \cdot I_{ref} \cdot T_{clk};$$

where M is the number of clock cycles, $I_{ref}$ is the temperature compensated reference current, and $T_{clk}$ is the period of the master clock. In one embodiment, as shown in FIG. 3, the second predetermined amount of charge 310 is designed to be ½ of the full-scale (FS) voltage, for example, 2 volts when the full scale (FS) voltage is 4 volts.

As shown in FIG. 3, the second predetermined charge level 310 that is removed from the integrating capacitor 44 can be greater than the charge in the integrating capacitor 44 before the second predetermined charge level 310 has been removed from the integrating capacitor 44 for each of the number of times. When the charge level removed from the integrating capacitor 44 is greater than the charge stored in the integrating capacitor 44, the residual charge in the integrating capacitor 44 has a polarity that is opposite from the polarity of the analog input signal after the second predetermined charge level 310 has been removed. In a preferred embodiment, the comparator 62 trips when the voltage at the output 49 is 1 volt. As a result as shown in FIG. 3, the folding circuit 30 removes 2 volts of charge from the integrating capacitor 44. Therefore, the charge level in the integrating capacitor 44 becomes −1 volt. Thus, the folding circuit 30 removes enough charge so that the amount of charge removed from the integrating capacitor 44 covers the entire range (positive and negative) of the supply voltage. As such, the analog to digital conversion circuit 10 uses the entire dynamic range of the supply voltage without using level-shifting circuitry.

The removal of the second predetermined charge level 310 from the integrating capacitor 44 is repeated as many times as dictated by the magnitude of the analog input signal. The digital logic circuit 60 generates the subtraction current 36 and tracks the number of times the second predetermined charge 310 is removed from the integrating capacitor 44. From the number of times that the second predetermined charge 310 is removed from the integrating capacitor 44, the binary output bits are determined. In one embodiment, the determination of the binary output bits is performed by comparing the amount of charge that has been removed from the integrating capacitor 44 to an amount of charge that is substantially equal to a bit. It should be appreciated that the binary output bits are provided as an output of the digital logic circuit 60. In one embodiment, the second predetermined amount of charge 310 substantially equals a charge level that corresponds to a most significant bit. In this embodiment, the analog to digital conversion circuit 10 can be used to resolve the entire amount of the most significant bits of the binary output bits. At the end of the integration cycle the residual charge can be supplied to an external residual charge quantizing circuit 450 (FIG. 4), such as, for example, an analog to digital conversion circuit. The residual charge quantizing circuit 450 resolves the least significant bits of the binary output bits from the residual charge level. Since each removal of the second predetermined charge level 310 is substantially similar and independent of the analog input signal, the charge associated with the switching of the current mirror switch 38 is substantially constant and can be included as part of the second predetermined charge level 310.

In even another embodiment, the second predetermined charge level 310 is substantially equal to a least significant bit. As such, the analog to digital conversion circuit 10 can resolve the total number of binary output bits because the residual charge left in the integrating capacitor 44 after the second predetermined charge level 310 has been removed a number of times is either zero or less than an least significant bit of charge. In the latter case, the residue charge quantizing circuit 450 is not required to resolve additional bits of the binary output bits.

In one embodiment, the end of the integration cycle is measured by the passage of a predetermined amount of time, such as, for example, 350 μs, as shown in FIG. 2. When the integration cycle has ended, the sample and hold circuit 50 determines the amount of residual charge level that is present in the integrating capacitor 44. As stated herein, the residual charge is substantially equal to the stored charge in the integrating capacitor 44 after the second predetermined charge level 310 has been removed for the number of times. In determining the residual charge level, the switch timing of the first and second sample switches 72 and 76 and the hold switch 74 is shown in FIG. 2. The first and second sample switches 72 and 76 are closed and the hold switch 74 is opened to sample the residual charge level in the integrating capacitor 44. After having the requisite time for the charge to settle, the sampled residual charge level in the integrating capacitor 44 is held by opening the first and second sample switches 72 and 76 and closing the hold switch 74. So that the sample and hold operation does not interrupt the removal of the second predetermined charge level 310, the removal operation is suspended for a fixed time before the hold operation is performed. In one embodiment as shown in FIGS. 2 and 3, the removal operation is suspended for about 50 μs. During this suspension time, a signal causing the comparator 62 to trip will not be acted upon by the synchronizer/digital logic circuit 66. In one embodiment, the residual charge level is supplied to a residue quantizing circuit 450 (FIG. 4). The residual charge quantizing circuit 450 determines additional bits of the binary output bits based on the residual charge level. In one embodiment, the residual charge quantizing circuit 450 comprises an external conventional analog to digital converter such as, for example, a dual slope analog to digital converter, a multiple slope analog to digital converter or a charge balance analog to digital converter. In even another embodiment, the analog to digital conversion circuit 10 is used to process its own residual charge. In this embodiment, the residue charge quantizing circuit 450 comprises the analog to digital conversion circuit 10 wherein the analog input signal comprises the residual charge in the integrating capacitor 44.

In another embodiment shown in FIG. 4, a multichannel analog to digital conversion circuit 400 receives the plurality of analog input signals, and each of the analog input signals is resolved into a plurality of binary output bits. The multichannel analog to digital conversion circuit 400 includes M number of channels, such as, a first channel 410, a second channel 420 and a Mth channel 430. The multichannel analog to digital conversion circuit 400 can include any number of channels as required by the application. In one embodiment, the multichannel analog to digital conversion circuit 400 includes 64 channels.

Each channel 410, 420 and 430, respectively, separately includes an integrate and fold circuit 412, 422 and 432, respectively, and a sample and hold circuit 414, 424 and 434, respectively. The channels 410, 420 and 430, respectively, are each connected to a multiplexer 440, and a residue quantizing circuit 450 is connected to the multiplexer 440. In this embodiment, the channels 410, 420 and 430, respectively, use the integrate and fold circuits 412, 422 and 432, respectively, and the sample and hold circuits 414, 424 and 434, respectively, to process a plurality of analog input signals in a pipeline configuration. In this embodiment, the integrate and fold circuits 412, 422 and 432, respectively, resolve the most significant bits of each of the plurality of binary output bits. The residual charge level from the integrate and fold circuits 412, 422 and 432, respectively, is sampled and held by the sample and hold circuits 414, 424, 434, respectively. During the hold operation, the residue quantizing circuit 450 is provided with the residual charge level of each of the channels 410, 420 and 430, respectively, via the multiplexer 440. The residue quantizing circuit 450 then provides the least significant bits of each of the plurality of binary output bits. As such, the most significant bits resolved from the integrate and fold circuits 412, 422 and 432, respectively, of each of the channels 410, 420 and 430, respectively, are combined with the least significant bits resolved by the residue quantizing circuit 450 to create each of the plurality of binary output bits from each of the plurality of analog input signals. As stated above, it should be appreciated that the residue quantizing circuit 450 can comprise an external analog to digital converter, such as, for example, a dual slope analog to digital converter, a multiple slope analog to digital converter or a charge balance analog to digital converter.

In another embodiment, the residual charge level from the multichannel analog to digital conversion circuit 400 can be supplied to another integrate and fold circuit 80 (FIG. 1) that is connected to the output 57 (FIG. 1) via switch 78 (FIG. 1). In this embodiment, additional integrate and fold circuits 80 are arranged in a pipeline or cascade configuration with the output 57 of each of the sample and hold circuit 50 (FIG. 1) being supplied to a next integrate and fold circuit 80. In even another embodiment, the cascade configuration can comprise, for example, four integrate and fold circuits cascaded in series wherein the first integrate and fold circuit resolves the most significant bits, and each of the subsequent integrate and fold circuits resolve additional bits of the binary output bits including additional most significant bits and/or least significant bits.

Figure 6:
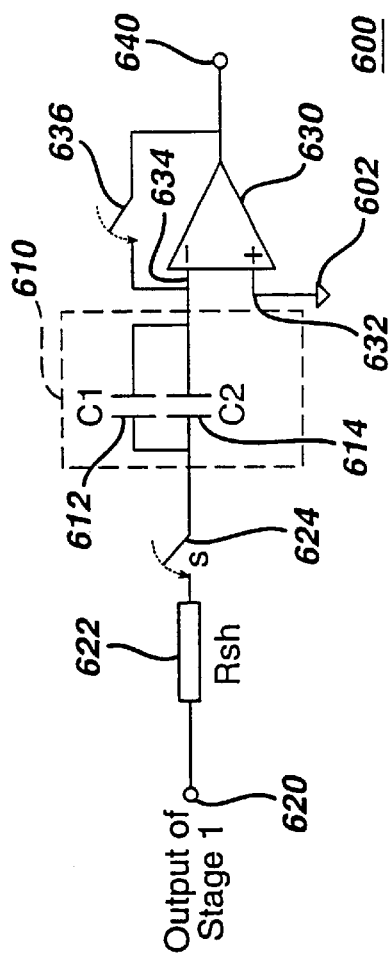
FIG. 6 illustrates one exemplary embodiment of a sample and hold circuit.

For example, as shown in FIG. 6, a sample and hold circuit 600 is connected via stage one output 620 to an integrate and fold circuit 80 (FIG. 1). In this embodiment, the integrate and fold circuit 80 is connected as the first stage of the cascaded series connection of integrate and fold circuits and sample and hold circuits. The sample and hold circuit 600 comprises a resistor 622 connected between the stage one output 620 and first sample switch 624. A sample and hold capacitor 610 is connected between the first sample switch 624 and inverting input terminal 634 of amplifier 630 while non-inverting input terminal 632 is connected to ground 602. In one embodiment, the sample and hold capacitor 610 comprises a first capacitor 612 and a second capacitor 614 connected in parallel. A second sample switch 636 is connected between the inverting input terminal 634 and the output 640 of the amplifier 630.

As shown in FIG. 6, the residual charge level from the integrate and fold 80 is supplied to the sample and hold circuit 600 via the first stage output 620. The residual charge level is sampled and stored in the sample and hold capacitor 610. In this embodiment, the parallel combination of first capacitor 612 and second capacitor 614 store the residual charge level, and the second capacitor 614 is designed to be a multiple times greater than the first capacitor 612. For example in this embodiment, the second capacitor 614 is ten times larger than the first capacitor 612, and, therefore, the second capacitor 614 hold ten times more charge than the first capacitor 612. Once the residual charge level is sampled in the sample and hold capacitor 610, the residual charge level is held using a procedure similar to that disclosed above in relation to FIG. 1. As will be explained, after holding the residual charge level, the sample and hold circuit 600 can be configured to resolve additional binary bits.

Figure 7:
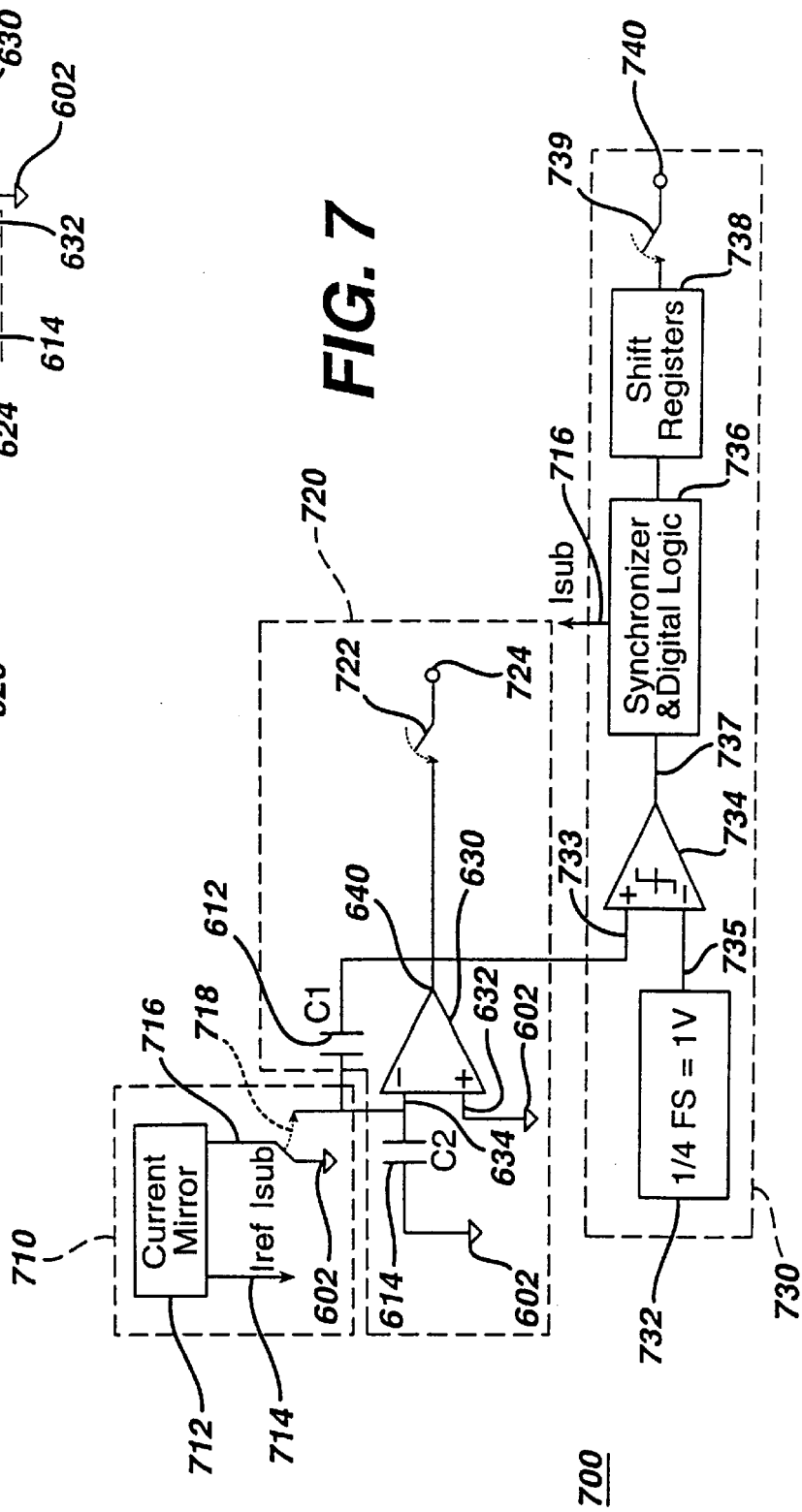
FIG. 7 illustrates one exemplary embodiment of a second stage analog to digital conversion circuit.

Similar to the embodiments above and as shown in FIG. 7, the analog to digital conversion circuit 700 includes an integrating operational amplifier circuit 720, digital logic circuit 730 and folding circuit 710. The integrating operational amplifier circuit 720 includes the sample and hold circuit 600 (FIG. 6) with the inverting input terminal 634 connected to the folding circuit 710 and the output 640 connected to an output switch 722 of stage two output 724 and digital logic circuit 730. Like the embodiments above, the folding circuit 710 includes a current mirror 712 connected to a reference current 714 and a subtraction current 716 which is connected to a current mirror switch 718 that is selectively connected between ground 602 and the inverting terminal 634 of the amplifier 630. The digital logic circuit 730 includes a comparator 734 having a non-inverting input terminal 733 connected to output 640 and an inverting terminal 735 connected to a power source 732. Output 737 of the comparator 734 is connected to synchronizer/digital logic 736 that generates the subtraction current 716 and is connected to shift register 738. Switch 739 is connected between the shift register 738 and the output 740.

Once the residual charge level is held in the sample and hold capacitor 610, the sample and hold circuit 600 is configured into integrate and fold circuit 720 of analog to digital conversion circuit 700 by connecting the second capacitor 614 to ground 602. As such, the first capacitor 612 becomes connected between the inverting input of the amplifier 630 and the output 640, and the first capacitor 612 operates similar to the integrating capacitor 44 (FIG. 1). Since the second capacitor 614 is connected to ground 602, the charge in second capacitor 614 is discharged into first capacitor 612. Since the second capacitor 614 is ten times larger than the first capacitor 612, the first capacitor 612 quickly becomes filled with charge. Once the charge in the first capacitor 614 becomes equivalent a third predetermined charge level, the digital logic circuit 730 connected to the output 640 of the amplifier 630 instructs the folding circuit 710 to remove a fourth predetermined charge level from the first capacitor 612. The third and fourth predetermined charge levels, respectively, can be set by voltage source 732 and reference current 714, respectively. The digital logic circuit 740 keeps track of the number of times the fourth predetermined charge level is removed from the first capacitor 612 and generates additional bits based on the amount of charge that has been removed. In a further cascade, an additional sample and hold circuit 600 can be connected to the second stage output 724 to determine the residual charge level in the first capacitor 612. Thus, the residual charge level of the second stage analog to digital conversion circuit 700 is provided to a third stage analog to digital conversion circuit (not shown), and even more additional bits can be resolved. As explained, additional analog to digital conversion circuits can be connected to resolve the entire binary output bits of the residual charge. In another embodiment, the residual charge can be sent to a residue quantizing circuit 450 (FIG. 4) to resolve the rest of the additional binary bits.

Figure 5:
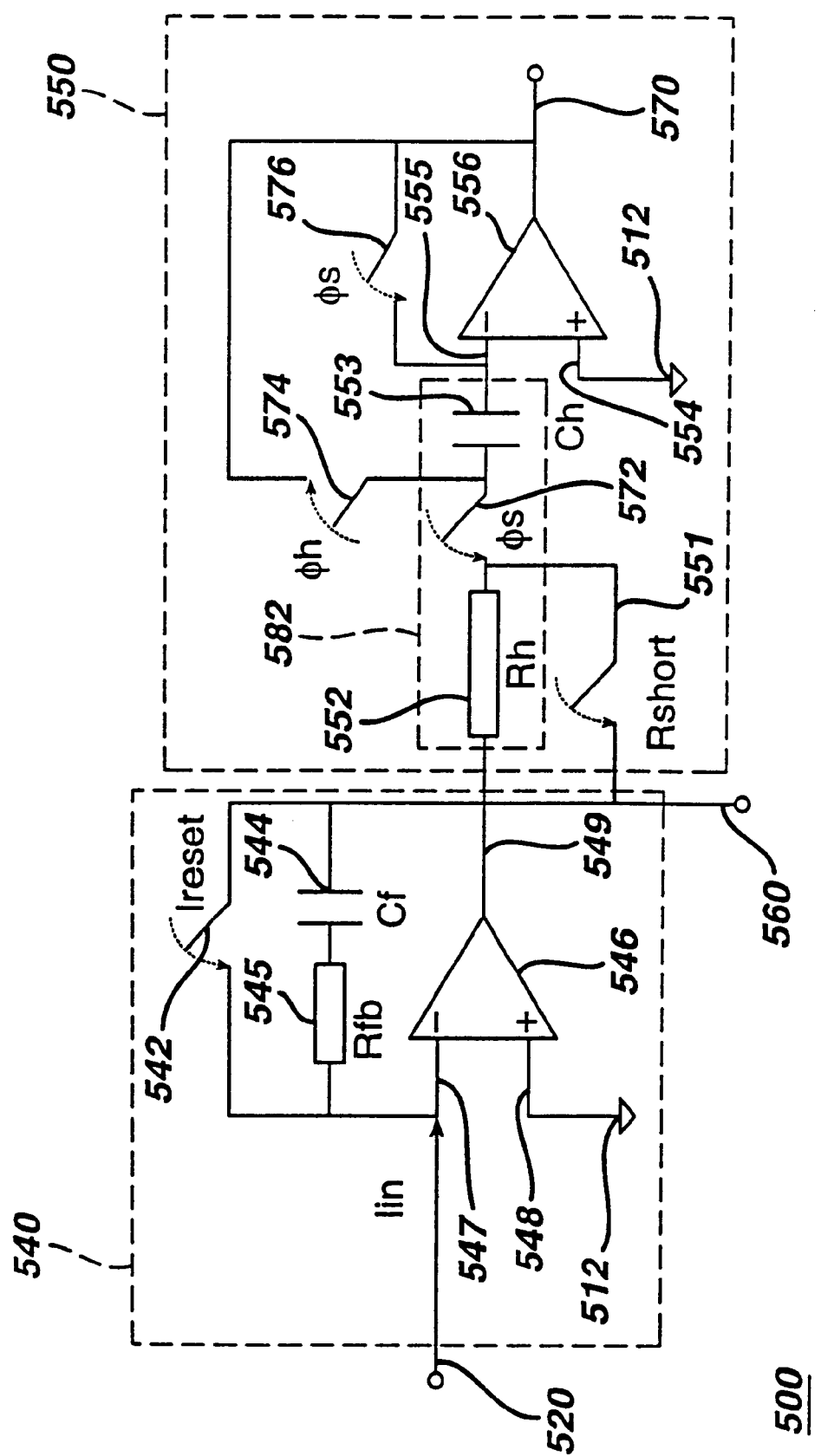
FIG. 5 illustrates a schematic diagram of an exemplary embodiment of an integrating amplifier and a low pass filter circuit.

In even another embodiment, as shown FIG. 5, the analog to digital conversion circuit 500 includes a bypass switch 551 to prevent low pass filtering during determination of the residual charge level in the integrating capacitor 544. In a preferred embodiment shown in FIG. 1, the analog input signal is generated from a photo-diode 22 (FIG. 1). Noise is introduced from the input signal circuit 20 (FIG. 1) and is proportional to the square root of the number of x-rays that impinge on the photo-diode 22. To minimize the noise with smaller analog input signals, a low pass filter 582 is provided. The low pass filter 582 includes a resistor 552 and a capacitor 553. For larger analog input signals, the low pass filter 582 impedes adequate settling from the output 549 of the operational amplifier 546. To meet the conflicting requirements of low noise requirements at low analog input signals and high bandwidth requirements at high input signals, the bypass switch 551 is provided.

In FIG. 5, the integrating operational amplifier circuit 540 includes an operational amplifier 546 having an inverting input terminal 547, a non-inverting input terminal 548 and an output 549. The non-inverting input terminal 548 is connected to ground 512, and the inverting input terminal 547 is connected to an input terminal 520. It should be appreciated that the input terminal 520 can be connected to input circuit 20 (FIG. 1) and folding circuit 30 (FIG. 1). A reset switch 542 is connected across the inverting input terminal 547 and the output 549. In addition, a feedback resistor 545 and an integrating capacitor 544 are connected in series between the inverting input terminal 547 and the output 549. A digital logic circuit input 560 is connected to the output 549. It should be appreciated that the digital logic circuit input 560 can be connected to a digital logic circuit 60 (FIG. 1).

The sample and hold circuit 550 includes the low pass filter 582 and the bypass switch 551. The resistor 552 is connected to the output 549, and the bypass switch 551 is connected across the resistor 552. The resistor is connected to the first sample switch 572 and a capacitor 553 is connected between the inverting input terminal 555 of the amplifier 556 and the first sample switch 572. A hold switch 574 is connected between the capacitor 553 and the output 570. A second sample switch 576 is connected across the inverting terminal 555 and the output 570. The non-inverting input terminal 554 is connected to ground 512.

The number of times the second predetermined charge level 310 (FIG. 3) is removed from the integrating capacitor 544 within the first clock cycle typically gives a good estimate of the magnitude of the analog input signal. In one embodiment, the first clock cycle is about 350 μs. If the analog input signal has a low magnitude, the number of times the second predetermined charge level 310 (FIG. 3) is removed from the integrating capacitor 544 is zero or a relatively low number. If the analog input signal has a high magnitude, the number of times the second predetermined charge level 310 (FIG. 3) is removed from the integrating capacitor 544 is relatively high. When the analog input signal is relatively high, low pass filtering of the output 549 is not desired. Therefore, if the number of times the second predetermined charge level 310 (FIG. 3) is removed is greater than a predetermined number, the bypass switch 551 is closed and the resistor 552 is shorted. As a result, the low pass filter 582 does not process the output 549 of the operational amplifier 546. In one embodiment, the predetermined number of times is three. It should be appreciated that the number of times the second predetermined charge level 310 (FIG. 3) is removed from the integrating capacitor 544 is tracked by the digital logic circuit 60 (FIG. 1), and, likewise, the digital logic circuit 60 (FIG. 1) directs the bypass switch 551 to close if the predetermined number of times is reached within the first clock cycle. Thus, by tracking the number of times the second predetermined charge level 310 (FIG. 3) is removed from the integrating capacitor 544 over a predetermined time, a determination is made whether to process the residual charge level from the output 549 by the low pass filter 582.

The foregoing discussion of the invention has been presented for purposes of illustration and description. Further, the description is not intended to limit the invention to the form disclosed herein. Consequently, variations and modifications commensurate with the above teachings, and with the skill and knowledge of the relevant art, are within the scope of the present invention. The embodiment described herein above is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

What is claimed is:

1. An analog to digital conversion circuit for converting an analog input signal into a plurality of binary output bits, said analog to digital conversion circuit comprising:

an operational amplifier having an inverting terminal for receiving said analog input signal and further having an output terminal;

an integrating capacitor connected between said inverting terminal and said output terminal of said operational amplifier, said integrating capacitor storing a charge proportional to an integral of said analog input signal;

a charge subtracting circuit selectively coupled to said inverting terminal and said output terminal of said operational amplifier, said charge subtracting circuit removing a first predetermined charge from said integrating capacitor when an output charge of said operational amplifier is substantially equal to a second predetermined charge level, said first predetermined charge being removed from said integrating capacitor a number of times wherein removal of said first predetermined charge from said integrating capacitor said number of times allows said integral of said analog input signal to be larger than a maximum charge capable of being stored by said integrating capacitor;

a digital logic circuit connected to said charge subtracting circuit, said digital logic circuit tracking said number of times that said first predetermined charge is removed from said integrating capacitor by said charge subtracting circuit, and said digital logic circuit providing at least one bit of said plurality of binary output bits;

a residue quantizing circuit connected to said integrating capacitor and said output of said operational amplifier, said residue quantizing circuit determining a residual charge in said integrating capacitor, said residual charge being substantially equal to the stored charge in said integrating capacitor after said first predetermined charge has been removed from said integrating capacitor said number of times, and said residue quantizing circuit providing at least one additional bit of said plurality of binary output bits corresponding to said residual charge; and a low pass filter circuit selectively coupled to said output terminal of said operational amplifier, said low pass filter connected to said output terminal when said number of times said first predetermined charge is removed from said integrating capacitor is less than a predetermined number.

2. The analog to digital conversion circuit of claim 1 wherein said low pass filter comprises a resistor and a capacitor connected in series.

3. The analog to digital conversion circuit of claim 1 wherein said number of times said first predetermined charge is removed from said integrating capacitor is measured over a predetermined amount of time.

4. The analog to digital conversion circuit of claim 3 wherein said predetermined number is three and said predetermined amount of time is 350 microseconds.

5. The analog to digital conversion circuit of claim 1 wherein said analog input signal comprises a current signal.

6. The analog to digital conversion circuit of claim 1 wherein said analog input signal comprises a voltage signal.

7. The analog to digital conversion circuit of claim 1 wherein said residual charge is less than said second predetermined charge.

8. The analog to digital conversion circuit of claim 1 wherein said first predetermined charge is greater than the stored charge in said integrating capacitor before said first predetermined charge has been removed from said integrating capacitor.

9. The analog to digital conversion circuit of claim 8 wherein a charge in said integrating capacitor after said first predetermined charge has been removed from said integrating capacitor for each of said number of times comprises a polarity opposite from a polarity of said analog input signal.

10. The analog to digital conversion circuit of claim 1 wherein said residue quantizing circuit comprises an analog to digital converter.

11. The analog to digital conversion circuit of claim 1 wherein said at least one bit provided by said digital logic circuit comprises a most significant bit.

12. The analog to digital conversion circuit of claim 1 wherein said at least one additional bit provided by said residue quantizing circuit comprises a least significant bit.

13. The analog to digital conversion circuit of claim 1 wherein said residue quantizing circuit comprises:

at least one integrate and fold circuit, each of said integrate and fold circuits being connected in a pipeline series configuration, each of said integrate and fold circuits comprising:

a sample and hold circuit connected to an output of a preceding integrate and fold circuit of said at least one integrate and fold circuit for receiving an integrate and fold residual charge, a first of said at least one integrate and fold circuit being connected to said integrating capacitor and said output terminal of said operational amplifier for receiving said residual charge from said integrating capacitor;

an integrate and fold operational amplifier having an inverting terminal and an output terminal, said sample and hold circuit being connected to said inverting terminal of said integrate and fold operational amplifier;

an integrate and fold integrating capacitor connected between said inverting terminal and said output terminal of said integrate and fold operational amplifier, said integrate and fold integrating capacitor storing an integrate and fold charge substantially proportional to an integral of said integrate and fold residual charge from said preceding integrate and fold circuit;

an integrate and fold charge subtracting circuit selectively coupled to said inverting terminal and said output terminal of said integrate and fold operational amplifier, said integrate and fold charge subtracting circuit removing a first integrate and fold predetermined charge from said integrate and fold integrating capacitor when an output charge of said integrate and fold operational amplifier is substantially equal to a second integrate and fold predetermined charge, said first integrate and fold predetermined charge being removed from said integrate and fold integrating capacitor a number of times;

an integrate and fold digital logic circuit connected to said integrate and fold charge subtracting circuit, said digital logic circuit tracking said number of times that said first integrate and fold predetermined charge is removed from said integrate and fold integrating capacitor by said integrate and fold charge subtracting circuit, and said integrate and fold digital logic circuit providing said at least one additional bit of said plurality of binary output bits.

14. An analog to digital converter for converting an analog input signal into a plurality of binary output bits, said analog to digital conversion circuit comprising:

an integration circuit receiving said analog input signal and storing a charge proportional to said analog input signal;

a subtracting circuit selectively coupled to said integration circuit and removing a first predetermined charge from said charge stored in said integration circuit when said charge stored in said integration circuit substantially equals a second predetermined charge, said first predetermined charge being removed from said integration circuit a number of times;

a logic circuit connected to said subtracting circuit and tracking said number of times that said first predetermined charge is removed from said integration circuit by said subtracting circuit and said logic circuit providing at least one bits of said plurality of binary output bits;

an analog to digital converter connected to said integration circuit, said analog to digital converter determining a residual charge in said integration circuit wherein said residual charge is substantially equal to the stored charge in said integration circuit after said first predetermined charge has been removed from said integration circuit for said number of times, and said analog to digital converter providing additional bits of said plurality of output bits corresponding to said residual charge; and a low pass filter circuit selectively coupled to said integration circuit, said low pass filter circuit connected to said output terminal when said number of times said second charge is removed from said integration circuit is less than a predetermined number.

15. The analog to digital conversion circuit of claim 14 wherein said analog input signal comprises a current signal.

16. The analog to digital conversion circuit of claim 14 wherein said analog input signal comprises a voltage signal.

17. A method for converting an analog input signal into a plurality of binary output bits, said method comprising the steps of:

supplying said analog input signal to an operational amplifier and an integrating capacitor wherein said integrating capacitor is connected between an inverting input terminal and an output terminal of said operational amplifier;

storing a charge proportional to an integral of said analog input signal in said integrating capacitor;

subtracting a first predetermined charge from said integrating capacitor when an output charge of said operational amplifier is substantially equal to a second predetermined charge;

tracking a number of times said first predetermined charge is subtracted from said integrating capacitor;

determining at least one bit of said plurality of binary output bits from said number of times said first predetermined charge is subtracted from said integrating capacitor by said step of subtracting said first predetermined charge wherein removal of said first predetermined charge from said integrating capacitor said number of times allows said integral of said analog input signal to be larger than a maximum charge capable of being stored by said integrating capacitor;

determining at least one additional bit of said plurality of binary output bits from a residual charge in said integrating capacitor, said residual charge being substantially equal to the stored charge in said integrating capacitor after said first predetermined charge has been removed from said integrating capacitor said number of times; and filtering an output of said operational amplifier using a low pass filter circuit when said number of times said first predetermined charge is subtracted from said integrating capacitor is less than a predetermined number.

18. The method of claim 17 wherein said analog input signal comprises a current signal.

19. The method of claim 17 wherein said analog input signal comprises a voltage signal.

20. The method of claim 17 wherein said step of determining said at least one additional bit comprises:

supplying said residual charge to said operational amplifier and said integrating capacitor wherein said integrating capacitor is connected between said inverting input terminal and said output terminal of said operational amplifier;

storing a charge proportional to an integral of said residual charge in said integrating capacitor;

subtracting a third predetermined charge from said integrating capacitor when an output charge of said operational amplifier is substantially equal to a fourth predetermined charge;

tracking a number of times said third predetermined charge is subtracted from said integrating capacitor;

determining said at least one additional bit of said plurality of binary output bits from said number of times said third predetermined charge is subtracted from said integrating capacitor by said step of subtracting said third predetermined charge.

21. The method of claim 17 wherein said first predetermined charge is greater the stored charge in said integrating capacitor after said first predetermined charge has been removed from said integrating capacitor each of said number of times.

22. The method of claim 21, wherein a charge after said first predetermined charge has been removed from said integrating capacitor for each of said number of times comprises a polarity that is opposite of a polarity of said analog input signal.

23. The method of claim 17 wherein said step of determining said at least one additional bit comprises providing said residual charge to an analog to digital converter wherein said analog to digital converter provides a least significant bit based on said residual charge level.

24. A method for converting an analog input signal into a plurality of binary output bits, said method comprising the steps of:

storing a charge proportional to an integral of said analog input signal;

subtracting a first predetermined charge from the stored charge when the stored charge is substantially equal to a second predetermined charge;

tracking a number of times said first predetermined charge is subtracted from the stored charge;

determining at least one bit of said plurality of binary output bits from said number of times said first predetermined charge is subtracted from the stored charge; and filtering an output when said number of times said first predetermined charge is subtracted from said stored charge is less than a predetermined number.

25. The method of claim 24, further comprising the step of determining additional bits of said plurality of binary output bits.

26. The method of claim 24 wherein said analog input signal comprises a current signal.

27. The method of claim 24 wherein said analog input signal comprises a voltage signal.

28. A multi-channel analog to digital conversion circuit for converting at least one analog input signal into at least one plurality of binary output bits, said multi-channel analog to digital conversion circuit comprising:

a plurality of channels;

a multiplexer having a plurality of inputs and an output, each of said plurality of inputs individually connected to a different one of said plurality of channels;

a residue quantizing circuit connected to said output of said multiplexer, said residue quantizing circuit receiving via said multiplexer a residual charges from each of said plurality of channels, said residue quantizing circuit respectively providing to each of said plurality of channels at least one additional bit of said plurality of binary output bits corresponding to said residual charge;

wherein, each channel of said plurality of channels comprises:

an operational amplifier having an inverting terminal connected to said analog input signal and having an output terminal;

an integrating capacitor connected between said inverting terminal and said output terminal of said operational amplifier, said integrating capacitor storing a charge proportional to an integral of said input signal;

a charge subtracting circuit selectively coupled to said inverting terminal and said output terminal of said operational amplifier, said charge subtracting circuit removing a first predetermined charge from said integrating capacitor a number of times when an output charge of said operational amplifier is substantially equal to a second predetermined charge wherein removal of said first predetermined charge from said integrating capacitor said number of times allows said integral of said analog input signal to be larger than a maximum charge capable of being stored by said integrating capacitor;

a digital logic circuit connected to said charge subtracting circuit, said digital logic circuit tracking said number of times that said first predetermined charge is removed from said integrating capacitor by said charge subtracting circuit and said digital logic circuit providing at least one bit of said plurality of binary output bits;

a sample and hold circuit connected to said integrating capacitor and said output terminal of said operational amplifier, said sample and hold circuit sampling and holding said residual charge in said integrating capacitor, said residual charge being substantially equal to a stored charge in said integrating capacitor after said first predetermined charge has been removed from said integrating capacitor said number of times; and a low pass filter circuit selectively coupled to said output terminal of said operational amplifier, said low pass filter connected to said output terminal when said number of times said first predetermined charge is removed from said integrating capacitor is less than a predetermined number.

29. The multi-channel analog to digital conversion circuit of claim 28 wherein said analog input signal comprises a current signal.

30. The multi-channel analog to digital conversion circuit of claim 28 wherein said analog input signal comprises a voltage signal.

* * * * *

UNITED STATES PATENT AND TRADEMARK OFFICE
CERTIFICATE OF CORRECTION

PATENT NO. : 6,366,231 B1
DATED : April 2, 2002
INVENTOR(S) : Naresh K. Rao et al.

It is certified that error appears in the above-identified patent and that said Letters Patent is hereby corrected as shown below:

Column 8,
Line 43, please delete "residual charge level is supplied to a residue quantizing" and insert -- residual charge is supplied to a residue quantizing --

Column 10,
Line 8, please delete "second capacitor 614 hold ten times more charge than the" and insert -- second capacitor 614 holds ten times more charge than the --
Line 50, please delete "first capacitor 614 becomes equivalent a third predetermined" and insert -- first capacitor 614 becomes equivalent to a third predetermined --

Column 15,
Line 61, please delete "mined charge is greater the stored charge in said integrating" and insert -- mined charge is greater than the stored charge insaid integrating --

Column 16,
Line 43, please delete "ing via said multiplexer as residual charges from each of" and insert -- ing via said multiplexer as a residual charge from each of --

Signed and Sealed this

Fourth Day of January, 2005

JON W. DUDAS
*Director of the United States Patent and Trademark Office*